United States Patent
Tendille et al.

(10) Patent No.: US 12,506,003 B2
(45) Date of Patent: Dec. 23, 2025

(54) SEMICONDUCTOR SUBSTRATE WITH NITRIDE INTERFACE LAYER

(71) Applicant: IVWorks Co., Ltd., Daejeon (KR)

(72) Inventors: Florian Tendille, Mougins (FR); Idris Amirouche, Vallauris (FR); Hyonju Chauveau, Vallauris (FR); Bernard Beaumont, Le Tignet (FR)

(73) Assignee: IVWORKS CO., LTD., Daejeon (KR)

( * ) Notice: Subject to any disclaimer, the term of this patent is extended or adjusted under 35 U.S.C. 154(b) by 358 days.

(21) Appl. No.: 18/014,621

(22) PCT Filed: Jul. 6, 2021

(86) PCT No.: PCT/FR2021/051243
§ 371 (c)(1),
(2) Date: Jan. 5, 2023

(87) PCT Pub. No.: WO2022/008836
PCT Pub. Date: Jan. 13, 2022

(65) Prior Publication Data
US 2023/0274934 A1    Aug. 31, 2023

(30) Foreign Application Priority Data
Jul. 6, 2020 (FR) ..................................... 2007150

(51) Int. Cl.
*C30B 25/02* (2006.01)
*C30B 29/40* (2006.01)
*H01L 21/02* (2006.01)

(52) U.S. Cl.
CPC .......... *H01L 21/0254* (2013.01); *C30B 25/02* (2013.01); *C30B 29/406* (2013.01);
(Continued)

(58) Field of Classification Search
CPC ... C30B 25/02; C30B 29/406; H01L 21/0254; H01L 21/02458; H01L 21/02505; H01L 21/02598; H01L 21/02609
See application file for complete search history.

(56) References Cited

U.S. PATENT DOCUMENTS 6,559,075 B1    5/2003  Kelly et al.
9,680,056 B1*   6/2017  Zhang .................. H10H 20/812
(Continued)

FOREIGN PATENT DOCUMENTS

EP    0 966 047 A2    12/1999
EP    1 245 702 A2    10/2002
(Continued)

OTHER PUBLICATIONS

International Search Report issued in corresponding International Application No. PCT/FR2021/051243, dated Sep. 30, 2021, with English translation.
(Continued)

*Primary Examiner* — Robert M Kunemund
(74) *Attorney, Agent, or Firm* — Foley & Lardner LLP

(57) ABSTRACT

Disclosed is a method for manufacturing a monocrystalline semiconductor material of the nitride of a group 13 element, comprising a step of depositing at least one separation layer comprising an element M selected among Ge, Zr, Y, Si, Se, Sc, Mg, In, W, La, Ti, Ta and Hf, by epitaxial growth on a starting substrate; characterised in that an interface layer of formula $M_vAl_xO_yN_z$ is deposited between the starting substrate and the separation layer, wherein: —the atomic indices x and z are greater than 0 and less than or equal to 1; and, —the atomic indices v and y are between 0 and 1; and—the sum y+z is greater than 0.9 and less than or equal to 1.5; and—the sum v+y is greater than or equal to 0.3 and less than or equal to 1.

18 Claims, 2 Drawing Sheets

(52) U.S. Cl.
CPC .. *H01L 21/02458* (2013.01); *H01L 21/02505* (2013.01); *H01L 21/02598* (2013.01); *H01L 21/02609* (2013.01)

(56) References Cited

U.S. PATENT DOCUMENTS

| | | |
|---|---|---|
| 2002/0152952 A1 | 10/2002 | Beaumont et al. |
| 2002/0175340 A1 | 11/2002 | Shibata et al. |
| 2004/0079949 A1 | 4/2004 | Chiyo et al. |
| 2007/0072396 A1 | 3/2007 | Feltin et al. |
| 2013/0178049 A1 | 7/2013 | Lee et al. |
| 2016/0002822 A1 | 1/2016 | Molnar |
| 2018/0174823 A1 | 6/2018 | Kim et al. |
| 2020/0032418 A1 | 1/2020 | Goto et al. |

FOREIGN PATENT DOCUMENTS

| | | | |
|---|---|---|---|
| EP | 1 246 233 A | 10/2002 | |
| EP | 1 361 616 A1 | 11/2003 | |
| KR | 10-2001-0031225 A | 4/2001 | |
| KR | 10-2002-0076167 A | 10/2002 | |
| KR | 10-2003-0069212 A | 8/2003 | |
| KR | 10-2006-0079249 A | 7/2006 | |
| KR | 10-2018-0069403 A | 6/2018 | |
| KR | 10-2019-0129854 A | 11/2019 | |
| WO | WO-02056393 A1 * | 7/2002 | ......... H01L 21/0237 |
| WO | WO-2005/031045 A2 | 4/2005 | |
| WO | WO-2018/180672 A1 | 10/2018 | |

OTHER PUBLICATIONS

Key et al., "Structural and Electrical Characterization of 2", Materials 2019, 12(12), 1925; https://doi.org/10.3390/ma12121925.

Liu et al., English abstract of "Substrates for gallium nitride epitaxy", Materials Science and Engineering: R: Reports, vol. 37, Issue 3, 2002, pp. 61-127, ISSN 0927-796X, https://doi.org/10.1016/S0927-796X(02)00008-6. (https://www.sciencedirect.com/science/article/pii/S0927796X02000086).

Liu et al., "Substrates for gallium nitride epitaxy", Materials Science and Engineering: R: Reports, vol. 37, Issue 3, 2002, pp. 61-127.

* cited by examiner

SEMICONDUCTOR SUBSTRATE WITH NITRIDE INTERFACE LAYER

FIELD OF THE INVENTION

The invention relates to the general technical field of the fabrication of substrates and wafers, made of a semiconductor material based on group 13 and 15 elements from the periodic table—such as gallium nitride, GaN.

These wafers are used as a substrate for producing semiconductor structures, such as light-emitting diodes (LED), laser diodes (LD), vertical transistors for power electronics, horizontal transistors for power electronics or (radio frequency) telecommunications, current rectifier diodes or sensors.

PRIOR ART

The current methods for manufacturing semiconductor substrate material based on a nitride of a group 13 or IIIA element relies on vapour deposition techniques, in particular heteroepitaxy which consists of growing a crystal, such as a gallium nitride GaN crystal, on a starting substrate of different nature, such as a sapphire substrate.

These methods use an injection system based on at least two different gaseous components which are able to interact before deposition.

Well-known methods include:
metalorganic vapour phase epitaxy (MOVPE),
hydride vapour phase epitaxy (HVPE),
close-spaced vapour transport (CSVT),
ceramic vapour deposition, etc.

Heteroepitaxy still remains the only solution for manufacturing components based on nitride of a group III element. The substrates used industrially for gallium nitride epitaxy are sapphire ($Al_2O_3$), silicon and silicon carbide (SiC). A consequence of the differences in lattice parameters and thermal expansion coefficients between these substrates and the nitride of a group III element is the formation of a large number of defects in the epitaxy layers, which degrades the performance of the electronic components produced with these materials. When the substrate is sapphire, techniques have been developed which consist in inserting between the substrate and the epitaxial layer of nitride of a group III element, a nucleation layer, for example formed of GaN or AlN deposited under distinct growth conditions. This surface treatment makes it possible to limit the density of defects.

Various techniques can be used in order to separate the layer of nitride of a group III element from its initial substrate, with the aim of obtaining a self-supporting layer.

U.S. Pat. No. 6,559,075 suggests, in particular, laser ablation which can decompose the GaN at the interface with the sapphire substrate. EP 0966047A2 proposes chemical attack of the substrate supporting the layer of a group III element which can also be used during the growth or after the epitaxial growth of the layer of a group III element. EP1245702A2 reveals, in particular, a method for manufacturing a self-supporting layer of GaN, starting with a sapphire substrate on which a metal layer is deposited and then an AlN film. The metal layer, which can include an element selected among Al, Au, Ag, Cu, Pt, Ni, Ti, Zr and Hf, facilitates the separation of the GaN layer from the substrate after epitaxial growth and acid or basic chemical attack. Said metal layer must not melt or react with ammonia or hydrogen gas during the growth phase. Preferred embodiments are proposed with application of a mask before or after depositing the metal layer.

EP1246233A2 suggests depositing a first layer of nitride of a group III element and then a metal film on the growth substrate, before performing a gas treatment in the growth chamber, in particular in an atmosphere comprising hydrogen. The metal layer comprises Sc, Y, Ti, Zr, Hf, V, Nb, Ta, Cr, Mo, W, Re, Fe, Ru, Os, Co, Cu, Pt, or Au. The gaseous treatment makes it possible to create voids in the first layer of nitride of a group III element in order to facilitate the subsequent separation of the second layer of nitride of a group III element forming the self-supporting layer.

WO2005031045A2 proposes depositing, on the substrate, a silicon-based sacrificial intermediate layer intended to be spontaneously vaporised in the later step of epitaxial growth of the layer of nitride of a group III element. The objective being to create a mechanically weak area at the interface between the substrate or growth seed and the future self-supporting layer of this nitride of a group III element in order that the large mechanical stresses (due to the difference in thermal expansion coefficient) drives a separation during the cooling and consequently without any particular gas addition.

More recently, it was proposed by US2013/0178049A1 to produce an intermediate layer formed of $NH_4Cl$ which ensures the automatic separation of the substrate and the self-supporting layer during cooling after epitaxial growth.

However, $NH_4Cl$ decomposes at too low a temperature to allow high-temperature growth, i.e. greater than 700° C. This results, at the end of growth, in too large a deformation of the crude crystal or the monocrystalline layer intended to form a wafer of nitride of a group 13 element after separation of the starting substrate.

US2016/0002822A1 suggests producing a separation layer, the composition of which includes a carbon material or boron nitride for example. As with EP1246233A2, the separation is not immediate and requires application of an additional mechanical stress.

There is therefore a need for a nitride material of an element from group 13 or III of the periodic table, in particular substrates and wafers of nitride material of a group 13 or III element, more particularly wafers and substrates composed of GaN, with high thickness, typically with thickness greater than 100 micrometres, or even 400 micrometres or more, and less than 20 mm, preferably between approximately 1 and 20 mm, preferably between approximately 5 and 10 mm, with width greater than or equal to approximately 50.8 mm obtained by heteroepitaxy, having very high properties in terms of crystal quality, a lower density of defects, a lower cracking rate and/or a greatly improved homogeneity, in particular with regard to crystal quality and electrical resistivity.

DESCRIPTION OF THE INVENTION

In this respect, the object of the invention is a method for manufacturing a monocrystalline semiconductor material of nitride of a group 13 element, in particular GaN, comprising the steps of:
a) depositing at least one separation layer comprising an element M selected among Ge, Zr, Y, Si, B, Sc, Mg, In, W, La, Ti, Ta, Hf or an alloy of these elements, by epitaxial growth on a starting substrate;

b) depositing, by epitaxial growth, at least one nucleation layer of formula $Al_rGa_sIn_tN_u$, such that the atomic indices comply with following relations: u=1 and r+s+t=1;

c) depositing, by epitaxial growth, at least one continuous monocrystalline layer of said semiconductor material of nitride of a group 13 element, with a thickness greater than 100 μm;

an interface layer of formula $M_vAl_xO_yN_z$ being deposited between said separation layer and said nucleation layer and/or between said starting substrate and said separation layer, wherein:

the atomic indices x and z are greater than 0 and less than or equal to 1, and the atomic indices v and y are between 0 and 1, the sum y+z is greater than 0.9 and less than or equal to 1.5, and the sum v+y is greater than or equal to 0.3 and less than or equal to 1.

The method can also include the following steps:

d) separating the starting substrate;

e) grinding, by removing at least one thickness of the monocrystalline layer, in order to obtain a wafer of nitride of a group 13 element with a thickness between 200 μm and 2000 μm, preferably between 300 and 600 μm.

By way of indication, unless otherwise mentioned, the indices of the chemical elements are atomic indices and the concentrations mentioned in the text are atomic concentrations.

Advantageously, but optionally, the method according to the invention can further comprise at least one of the following features or any combination of these features:

the separation layer has a thickness less than 1 μm;

the atomic index r is greater than 0, preferably greater than 0.5;

the sum of the indices s+t is less than 0.5; according to a possible embodiment, t is substantially equal to 0, preferably equal to 0;

the nucleation layer of formula $Al_rGa_sIn_tN_u$ has a thickness between 50 and 1000 nm. Preferably, the nucleation layer is a crystalline layer of $Al_xGa_{1-x}N$ with x between 0.55 and 1;

the separation step is carried out by chemical reaction or by physical transformation of the separation layer after step c), preferably with little or no application of external energy;

the separation layer contains the element M preferably selected among Ge, Zr, Y, Si, B, Sc, Mg, In, W, La, Ti, Ta, Hf and still more preferably selected among: Ge, Si, B, Mg, In;

the separation layer may contain two elements M1 and M2 or more, preferably selected among Ge, Zr, Y, Si, B, Sc, Mg, In, W, La, Ti, Ta, Hf. They may be deposited successively in thin layers or even in alloy form;

the separation layer is formed of two or more successive layers containing an element M selected among Ge, Zr, Y, Si, B, Sc, Mg, In, W, La, Ti, Ta, Hf, each separation layer having a different element from that of the separation layer which supports it;

the separation and nucleation layers and the interface layer are deposited at a growth speed less than 10 micrometres per hour according to a MOVPE or MBE technique;

the index y is equal to 0 if said interface layer is deposited between the separation layer and the nucleation layer, and/or the index v is equal to 0 if said interface layer is deposited between the starting substrate and the separation layer;

the interface layer deposited between the separation layer and the nucleation layer is a crystalline layer, and/or the interface layer deposited between the starting substrate and the separation layer is an amorphous layer;

a first interface layer of formula $Al_xO_yN_z$, wherein the atomic indices x, y and z are less than or equal to 1, is deposited between the starting substrate and the separation layer, and a second interface layer of formula $M_vAl_yN_z$, wherein the atomic indices v, y and z are less than 1, is deposited between said separation layer and said nucleation layer;

the separation layer is a monocrystalline layer;

if it is formed by a crystal with cubic crystal symmetry, it is oriented along the directions <111>, <110> or <100>, preferably this monocrystalline layer is epitaxial in the direction <111>;

optionally, a seed layer of gallium nitride can be deposited on the nucleation layer, preferably by MBE, MOVPE or HVPE.

Its thickness is preferably between 0.5 and 10 micrometres;

the continuous monocrystalline layer of said semiconductor material of nitride of a group 13 element is obtained by epitaxial growth according to a HVPE technique.

the separation, nucleation and seed layers and the interface layer according to the invention are deposited at low growth speed using an atomic layer deposition (ALD), physical vapour deposition (PVD), MOVPE or molecular beam epitaxy (MBE) technique;

the thickness of the interface layer is greater than 0.1 nanometres and/or less than 100 nanometres, preferably less than 50 nanometres, preferably less than or equal to 10 nanometres.

the interface layer deposited between the starting substrate and the separation layer is preferably crystalline. Preferably, the index v of its formula $M_vAl_xO_yN_z$ is less than 0.1, preferably substantially equal to 0.

This interface layer referred to as "AlON" in the remainder of the present application preferably consists substantially of oxygen, nitrogen and aluminium. It is formed by annealing a sapphire substrate at a temperature greater than 700° C. in an environment containing ammonia gas. Its thickness preferably between 0.1 nm and 100 nm, or even 10 nm, is obtained by annealing for approximately 5 minutes at 1000° C. in a gaseous environment containing $NH_3$. The inventors have notably discovered that once covered with the separation layer, which is composed of a material other than a nitride of a group III element, the interface layer, advantageously stabilised at low temperature (<700° C.), was not sublimated during the growth phase of the nucleation layer or that of the monocrystalline layer of nitride of a group 13 element, in other words before the separation step. Moreover it has been observed that this interface layer, formed substantially of oxygen, nitrogen and aluminium, contributes to reducing the risk of cracking of successive separation and nucleation layers and layer of nitride of a group III element before separation step d).

the interface layer deposited between the separation layer and the nucleation layer is preferably amorphous. Preferably, the index y of its formula $M_vAl_xO_yN_z$ is less than 0.1, preferably substantially equal to 0.

This interface layer referred to as "MAIN" in the remainder of the present application, preferably consists substantially of an element M, nitrogen and aluminium. It is formed by bringing ammonia gas at a temperature greater than 700° C. into contact with the separation layer followed by the depositing a crystalline nucleation layer of aluminium nitride and gallium nitride or even indium nitride. During this deposition at a temperature greater than 700° C., the aluminium of the nucleation layer diffuses into the MN layer in order to form MAIN.

The thickness of this interface layer is preferably between 0.1 and 100 nanometres (nm). This interface layer considerably improves the coalescence of the nucleation layer and consequently reduces the misorientation of its grains.

It has been observed by the inventors that the interface layer between the separation layer and the nucleation layer leads to an increase in crystal quality of the nucleation layer which is better coalesced, and this homogeneously over the slab.

The quality of the monocrystalline layer of nitride of a group 13 element is strongly improved (less dislocations or less inclusions of nitrides of a group III element having a misorientation of the main crystal axis with respect to the crystal matrix (>5°)).

Furthermore, due to the misorientation of the crystal grains which compose the nucleation layer, during HVPE growth, the surface of the three-dimensional growth front of the group III element layer can have local disparities in the crystal facets exposed at the surface. The direct consequence is a local doping difference due to the difference in incorporation of dopants depending on the crystal facet exposed. There is therefore an interest in having a reduced grain misorientation and homogeneous over the entire wafer in order to obtain similar electrical properties in different places on the wafer after HVPE growth.

In addition, a better coalesced, weakly misoriented and homogeneous nucleation layer over the entire wafer reduces the variations which it can have at the surface of the three-dimensional growth front of the layer of a group III element during HVPE growth.

The direct consequence is that after grinding of the layer of a group III element coming from growth by HVPE, a flat and continuous surface is obtained, having no voids or depressions greater than 50 μm in diameter and preferably not greater than 25 μm in diameter.

Another object of the invention is a crude crystal of nitride of a group 13 element, preferably gallium nitride, that can be obtained by implementing the method described above, and having the following features:
  a crystal radius of curvature greater than 11 m,
  a width at half height of the x-ray diffraction peak (XRD) of the (002) line around the angle ω under symmetric conditions of the GaN (0001) planes less than 120 arcsec, and a width at half height of the x-ray diffraction peak (XRD) of the 201 line around the angle ω under oblique conditions of the GaN (0001) films, less than 240 arcsec,
  a surface macrodefect density less than 3 cm$^{-2}$,
  a width at half height of the x-ray diffraction peak (XRD) of the (002) line around the angle ω under symmetric conditions of the GaN (0001) planes less than 90 arcsec, and a width at half height of the x-ray diffraction peak (XRD) of the 201 line around the angle ω under oblique conditions of the GaN (0001) films, less than 150 arcsec,
  a cracking rate measured by optical microscopy and corresponding to the sum of the length of the cracks of the crystal divided by the diameter of the crystal is less than 0.5.
  a ratio of the resistivity measured at 40 mm from the centre of the crystal and at the centre of the crystal, less than 1.6, and
  a difference in absolute value between the width at half height of the x-ray diffraction peak (XRD) of the (002) line around the angle ω under symmetric conditions of the GaN (0001) planes measured at 40 mm from the centre and that measured at the centre of the crystal, less than 20 arcsec.

Another object of the invention is a two-dimensional wafer of nitride of a group 13 element, in particular GaN, obtained by epitaxial growth according to the preceding method, in that it has the following features:
  the crystal radius of curvature is greater than 11 m,
  the surface macrodefect density is less than 6 cm$^{-2}$ preferably less than 5 cm$^{-2}$ and preferably less than 3 cm$^{-2}$,
  the crystal quality is measured by the width at half height of the x-ray diffraction peak (XRD) of the (002) line around the angle ω under symmetric conditions of the GaN (0001) planes is less than 130 arcsec, preferably less than 120 arcsec, preferably less than 100 arcsec, preferably less than 90 arcsec, or even less than 60 arcsec and the width at half height of the x-ray diffraction peak (XRD) of the 201 line around the angle ω under oblique conditions of the GaN (0001) films is less than 240 arcsec, preferably less than 150 arcsec, preferably less than 140 arcsec, or even less than 100 arcsec,
  the ratio of the resistivity measured by the Hall effect at the periphery of the slab, in particular at 40 mm from the centre of the wafer, over that of the centre of the wafer is less than 1.6,
  the difference in absolute value between the width at half height of the x-ray diffraction peak (XRD) of the (002) line around the angle ω under symmetric conditions of the GaN (0001) planes measured at 40 mm from the centre of the wafer and that measured at the centre of the wafer, is less than 20 arcsec, preferably less than 15 arcsec,
  a cracking rate measured by optical microscopy and corresponding to the sum of the length of the cracks of said crystal wafer divided by the diameter of said wafer is less than 0.5, preferably less than 0.25,
  a continuous surface of nitride of a group 13 element (0001), in particular if the group 13 element is Ga, a continuous Ga face surface, having no voids or depressions greater than 50 μm in diameter, preferably no voids or depressions greater than 25 μm in diameter.

Another object of the invention is the use of a two-dimensional wafer of nitride of a group 13 or III element according to one of the preceding features, as substrate for the manufacture of optoelectronic and/or electronic components, such as light-emitting diodes, laser diodes, vertical transistors for power electronics, horizontal transistors for power electronics or (radio frequency) telecommunications, current rectifying diodes or sensors.

DESCRIPTION OF THE FIGURES

Other features, goals and advantages of the present invention will become apparent on reading the following detailed description, with reference to the figures, given by way of non-limiting examples and in which.

DETAILED DESCRIPTION OF AT LEAST ONE EMBODIMENT OF THE INVENTION

Definitions

The cracking rate is measured on the crystal or the crystal wafer by optical microscopy and corresponds to the sum of the length of the cracks of said crystal or said wafer divided by its diameter.

Macrodefects means macro-inclusions having a size greater than 10 µm mainly composed of macles, domain inversions, or even polycrystallites potentially present in the crystal matrix. These defects are likewise detected and measured by optical microscopy.

The crystal curvature is measured by diffraction of rays as described in publication "curvature and bow of bulk GaN substrates" de Humberto M. Foronda et al. published in Journal of Applied Physics 120, 035104 (2016). The crystal radius of curvature Rc is thus defined by the following relation: $Rc=D^2/(8fc)$ wherein fc designates the crystal flexure and D the diameter of the wafer or of the crystal expressed in metres.

The electrical resistivity is measured by the Hall effect using the method of Van der Pauw.

The resistivity ratio is the ratio between the resistivity measured at 40 mm from the centre of the wafer over that at the centre of the crystal wafer.

Figure 1:
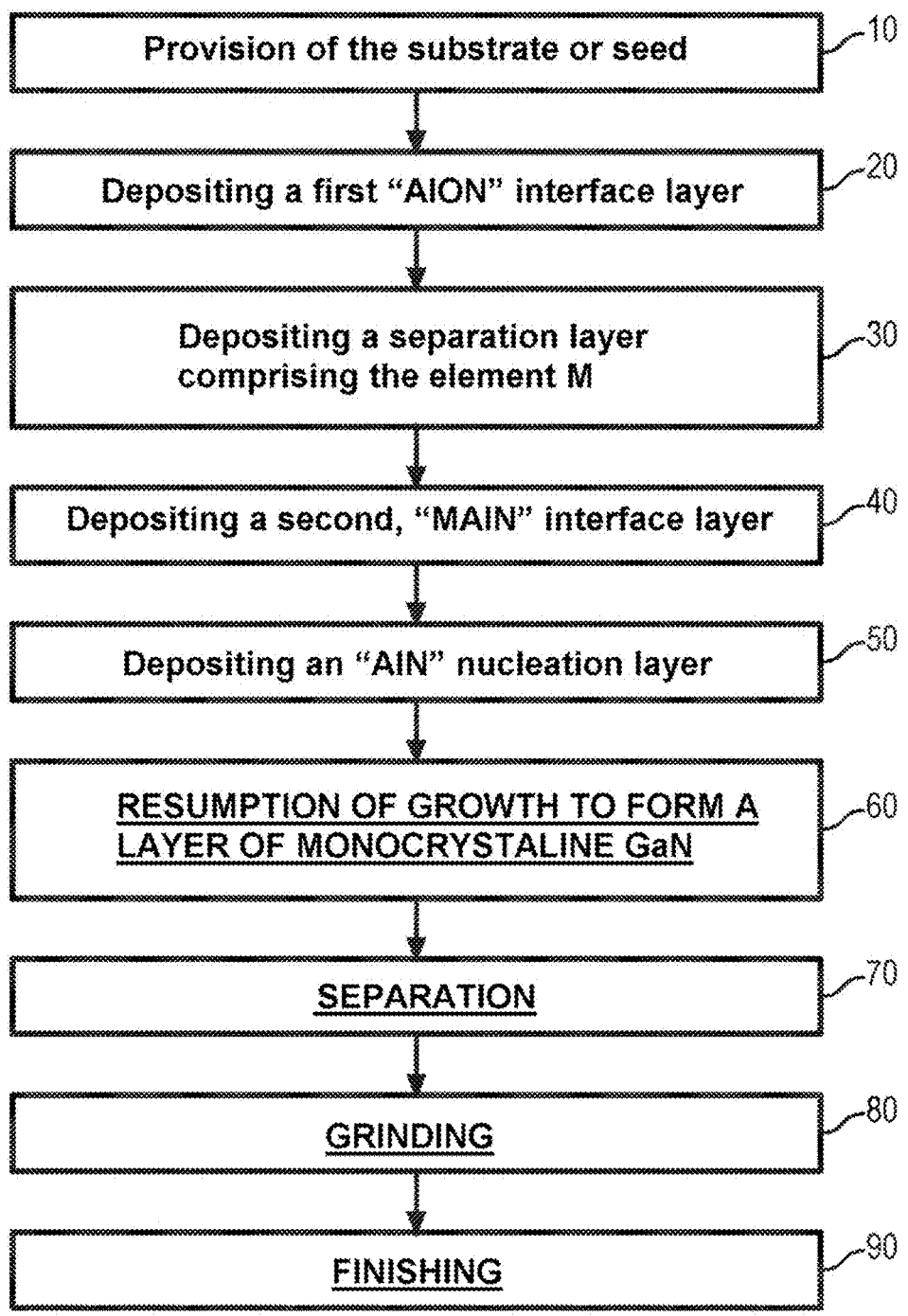
FIG. 1 summarises the possible main steps of the method for manufacturing a substrate according to an embodiment of the invention.
Figure 2:
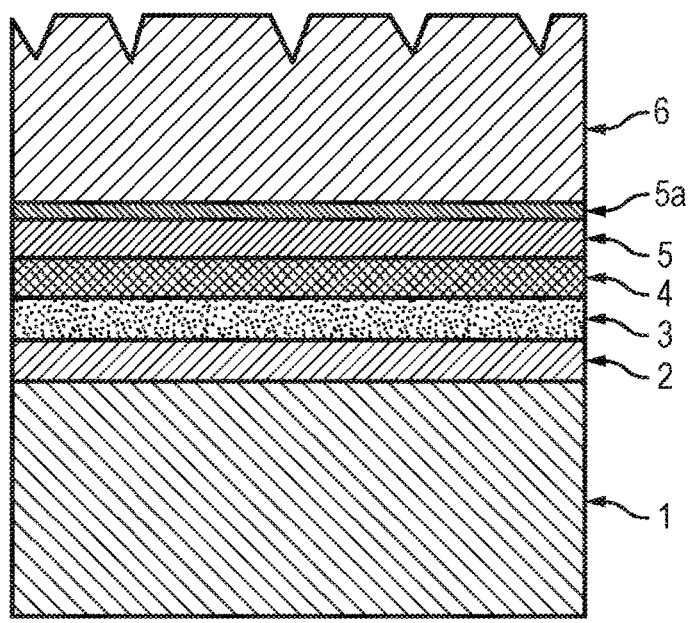
FIG. 2 shows, schematically, a semiconductor material composed of a stack of layers according to a possible embodiment of the invention.

FIGS. 1 and 2 show the possible major phases of the method for manufacturing GaN wafers.

In the following, the method according to the invention as described with reference to the manufacture of wafers of gallium nitride GaN.

However, it is obvious to a person skilled in the art that the method described below can be used to grow a material including a layer of nitride of a group 13 element other than gallium nitride GaN.

1. Manufacturing Method

The method comprises:
a phase 10 of providing a starting substrate 1.
an optional phase 20 during which a first interface layer 2 preferably aluminium oxynitride, preferably crystalline, is formed on the starting substrate 1. This optional phase is particularly advantageous if it is desired to reduce the cracking rate or to improve, more particularly, the crystal quality of the final monocrystalline layer of a group 13 element.
a phase 30 of forming a separation region 3 comprising the element M selected among Ge, Zr, Y, Si, B, Sc, Mg, In, W, La, Ti, Ta, Hf or an alloy of these elements. M is preferably selected among: Ge, Si, B, Mg, In. According to an embodiment, it is possible to successively deposit a plurality of different metals M.
a phase 40 of depositing a second interface layer 4 preferably of nitride of element M, preferably amorphous. This phase 40 of depositing can be optional, if phase 20 is carried out.
a phase 50 of depositing a nucleation layer 5 of aluminium nitride and gallium nitride, preferably crystalline. During the depositing of this layer 5, the aluminium can diffuse in contact with the separation layer 3 and transform the second interface layer 4 to the nitride of element M and aluminium, MAlN. This improves the crystal cohesion of the layer 5. The formula of the final nucleation layer 5 is preferably $Al_xGa_{1-x}N$, in which x is between 0.55 and 1.
an epitaxy resumption phase 60 in order to form a thick layer of GaN 6;
a separation phase 70 in order to obtain a self-supporting crude crystal GaN 6a;
a grinding phase 80 to remove a thickness of the self-supporting crude crystal GaN 6a;
a finishing phase 90 in order to form the GaN wafers 7 from said GaN crystal 6a, in particular, a phase of polishing by CMP in order to make the surface of the wafer compatible with a resumption of epitaxy of nitride of a group III element.

1.1. Phase 10 Providing a Substrate and Phase 20 Depositing an Interface Layer 2 of Aluminium Oxynitride:

The starting substrate 1 is a crystal seed made of a material which can be selected among Si, AlN, GaN, GaAs, $Al_2O_3$ (sapphire), ZnO, SiC, $LiAlO_2$, $LiGaO_2$, $MgAl_2O_4$, 4H-SiC, or any other type of starting substrate known to a person skilled in the art for growing gallium nitride, preferably sapphire. It can have a thickness of several hundred micrometres, generally 350 micrometres. The miscut angle can be between 0.1 and 5.0 degrees, preferably between 0.2 and 0.8 degree, and yet more preferably between 0.3 and 0.6 degree (in particular to limit stacking faults).

The growth of the interface layer 2 can be performed according to various alternatives. In particular, the substrate is first heated in a metalorganic vapour phase epitaxy (MOVPE) reactor chamber to a temperature between 80° and 1100° C. under nitrogen at a pressure of between 20 and 800 mbar, in particular preferably between 85° and 1050° C. and approximately 100 to 150 mbar. Ammonia is then introduced into the chamber at a concentration between 10 and 30 slm for 5 to 30 minutes. The temperature is then reduced to 850° C. or less, or even less than 700° C., before forming the separation layer 3.

The interface layer 2 is preferably crystalline. Preferably, the index v of its formula $M_vAl_xO_yN_z$ is less than 0.1, preferably substantially equal to 0.

This interface layer 2 referred to as "AlON" in the remainder of the present application consists substantially of oxygen, nitrogen and aluminium.

The thickness of the interface layer 2 is greater than 0.1 nanometres and/or less than 100 nanometres, preferably less than 50 nanometres, preferably less than 10 nanometres.

1.2. Phase 30 Forming a Separation Region:

Moreover the method comprises a phase 30 of forming a separation region 3. This phase 30 may consist of depositing a sacrificial intermediate layer, such as described for example in documents U.S. Pat. No. 7,790,489B2; CN102226985A; EP2204477A1; WO2014114730A1; KR101117189B1; US2007082465A1; EP1 699 951A1 or US2011124139A1.

Said layer is preferably continuous with thickness less than 10 micrometres.

It may have closed cavities in its volume, less than 200 nanometres in diameter.

The separation layer 3 contains the element M, preferably selected among Ge, Zr, Y, Si, B, Sc, Mg, In, W, La, Ti, Ta, Hf. The separation layer may contain two elements M1 or M2 or more, preferably selected among Ge, Zr, Y, Si, B, Sc, Mg, In, W, La, Ti, Ta, Hf. They can be deposited successively in thin layers, or even in the form of an alloy. The separation layer is preferably a monocrystalline layer.

1.3. Phase 40 of Depositing an Interface Layer of Nitride of Element M and Aluminium:

The interface layer 4 deposited between the separation layer 3 and the nucleation layer 5 is preferably amorphous. Preferably, the index y of its formula $M_vAl_xO_yN_z$ is less than 0.1, preferably substantially equal to 0.

This interface layer 4 referred to as "MAIN" in the remainder of the present application, preferably consists substantially of an element M, nitrogen and aluminium.

The growth of the interface layer 4 can be performed according to various alternatives. In particular, the substrate on which the separation layer has been deposited is taken to a temperature greater than approximately 700° C., preferably between approximately 850 and approximately 1100° C., under nitrogen at a pressure between approximately 50 and approximately 500 mbar, in particular at a pressure less than 100 mbar. Ammonia is then introduced into the chamber over several seconds, in order to activate the surface of the separation layer comprising the element M, then after forming the interface layer 4, an organic precursor of aluminium, preferably trimethylaluminium is introduced into the reactor chamber via the nitrogen as carrier gas in order to form a surface layer of nitride of element M and aluminium by reaction with the element M before then forming an AlN nucleation layer.

The thickness of this interface layer 4 is preferably greater than 0.1 nanometres and/or less than 100 nanometres, preferably less than 50 nanometres, preferably less than or equal to 10 nanometres. This interface layer 4 considerably improves the coalescence of the nucleation layer 5 described above, and consequently reduces the misorientation of its grains.

1.4. Phase 50 Forming a Nucleation Layer

The preceding phase is continued in such a way as to form a continuous layer with thickness between approximately 50 and approximately 1000 nm, preferably between approximately 50 and approximately 500 nm of AlN, referred to as the nucleation layer 5 on which a thick layer of GaN can be formed by resumption of epitaxy. During this deposition at a temperature greater than 700° C., the aluminium of the nucleation layer diffuses into the MN layer in order to form MAIN. Preferably, the final formula for nucleation layer 5 is $Al_xGa_{1-x}N$, in which x is between 0.55 and 1.

Optionally and advantageously, an additional seed layer 5a is deposited on the nucleation layer 5, in particular a layer of nitride of a group III element of general formula $Al_xGa_y$-$In_zN$, preferably a GaN layer with orientation (0001) and thickness 0.5 to 10 micrometres, can be deposited, preferably by MOVPE. The depositing of this additional layer 5a can reduce the stresses between the AlN layer and the GaN HVPE layer subsequently epitaxied on the nucleation layer 5. Indeed, the depositing of this additional layer 5a can ensure a transition between the AlN layer and the GaN layer deposited by HVPE, by limiting the number of crystal defects generated due to the difference in crystal structures. The growth of this GaN layer with orientation (0001) can be preceded by depositing a dielectric $Si_xN_y$ layer as described in documents WO 99/020816 and EP1338683B1 following a deposition of GaN at a temperature less than 700° C., which will then be annealed at more than 900° C. in order to recrystallise. Finally, a deposition of GaN at a temperature close to that for the annealing can be carried out on the recrystallised GaN layer.

Optionally, the growth of a first GaN layer can be carried out according to various alternatives. In particular, lateral overgrowth can be based on:
the use of a dielectric mask including openings in which islets form, as described in document WO99/20816;
the use of a dielectric layer with no openings, on which islets spontaneously form, as described in document EP 1338683.

In particular, the masking step can be carried out by optical photolithography (or by "nanoimprint"). It comprises the depositing of a mask made of dielectric material, such as $Si_xN_y$ (SiN, $Si_3N_4$, etc.) or of $SiO_2$ or TiN, having openings. The openings can be points or in the form of strips, and make it possible to define positions for the selective subsequent growth of GaN islets.

The mask can be formed by any technique known to a person skilled in the art. For example, forming the mask may consist in:
depositing a dielectric layer from gaseous silane and ammonia precursors, and
engraving the dielectric layer by photolithography, in order to form the openings.

The engraving of the layers of nitride of group III elements is then carried out by physicochemical means (for example by reactive ion etching, RIE). The engraving must be stopped before reaching the separation layer 3.

According to one possible method, the substrate or seed is masked before resuming the epitaxy consisting in forming the GaN layer 6, or even before depositing of the additional seed layer of GaN previously described.

The masked and engraved seed is then introduced into a reactor for thickening of the GaN layer 6 in phase 60 and its separation in phase 70.

1.5. Phase 60 Resumption of Epitaxy

The method comprises a resumption of epitaxy phase 60 in order to form a thick layer of GaN.

The method can also be started directly after the nucleation phase, by forming a thick layer of GaN 6, the seed phase being optional.

This resumption of epitaxy can be implemented by:
Metalorganic vapour phase epitaxy (MOVPE);
Hydride vapour phase epitaxy (HVPE);
Close-spaced vapour transport (CSVT); or again by
Liquid phase epitaxy (LPE).

It is preferred to use HVPE technology during this step, which allows three main interesting effects to be obtained:
a first effect is that the first GaN layer 6 is thickened without losing its crystalline qualities (no new dislocations or cracks are generated),
a second effect is that the dislocation density is again reduced during resumption of HVPE epitaxy, by a factor equal to at least 2, beyond 100 µm of GaN (0001) growth (ref https://doi.org/10.1143/APEX.5.095503), and
a third effect is that the thick layer of GaN 6 thus obtained can, in certain cases, allow the spontaneous separation of its starting substrate 1 at the separation region 3 in the event of sublimation or mechanical fracture of said region during the growth by HVPE.

More precisely, the resumption is carried out according to the following procedure: the temperature is increased in a mixed atmosphere of nitrogen, ammonia and hydrogen. Once the temperature of approximately 1000° C. is reached in a stable manner, the growth phase of an epitaxial layer of GaN is then triggered by introducing, into the vapour phase, gallium chloride (GaCl) obtained by reaction of HCl with liquid gallium held at a temperature of at least 800° C. The GaCl and ammonia are partially pyrolised in the growth chamber, the temperature of which is maintained at approximately 1000° C. Thus, a monocrystalline deposition of GaN gradually forms at the nucleation substrate (formed during the first growth phase).

It is necessary to obtain a sufficiently thick GaN film, therefore sufficiently strong from a mechanical point of view, to avoid fracture of the GaN layer into pieces of small area during the separation, and to facilitate its handling without risk of breakage. The growth then continues for several hours under these experimental conditions in order to attain a thickness of at least 200 microns for the GaN layer and preferably a thickness greater than 1 mm.

The growth is then finally completed by diverting the flow of HCl to the outside and cooling takes place in an atmosphere formed of nitrogen and ammonia.

The growth conditions of this monocrystalline layer 6 are typically a growth temperature between 90° and 1200° C., with a growth speed that can be between 50 and 500 micrometres/h, preferably between 70 and 200 micrometres/h.

The self-supporting crude crystal of GaN 6a thus obtained has a thickness greater than 200 μm and preferably greater than 1 mm. Its maximum thickness is less than 10 mm, or even less than 5 mm.

The diameter of the self-supporting crude crystal of GaN 6a thus obtained has a diameter greater than 50 mm and preferably a diameter greater than 100 mm. Its maximum diameter is less than 250 mm, or even less than 200 mm.

1.6. Separation Phase 70

A separation phase 70 is also implemented; this is dependent on the implemented alternative of phase 30 for forming the separation region 3.

In the case of depositing an intermediate sacrificial layer, this separation takes place during the resumption of epitaxy by spontaneous vaporisation of the intermediate layer or by mechanical fracture at the so-called sacrificial layer.

In the case of post-growth separation, a laser or other intense heat source can be used to vaporise the sacrificial layer.

Figure 3:
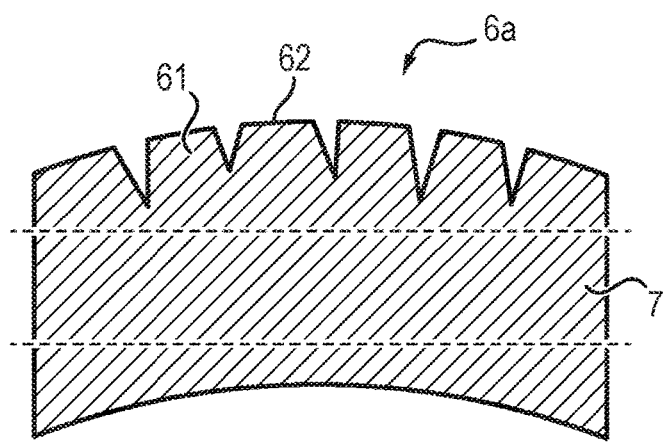
FIG. 3 illustrates the steps of grinding and finishing according to a possible embodiment in order to obtain a wafer of a monocrystalline material of nitride of a group 13 element of the invention.

A self-supporting crystal of GaN 6a is thus obtained, as illustrated in FIG. 3.

As is common in HVPE, the GaN crystal 6a comprises protrusions 61 in the form of hexagonal pyramids on a front face 62.

Such a crystal, illustrated in FIG. 3, is domed and has a crystal radius of curvature less than 25 metres and preferably less than 20 metres (crystal radius of curvature of the front face 62), like that of the crystal face opposite said front face 62.

In the example of FIG. 3, this crystal radius of curvature is 5 metres or more; furthermore, the crystal 6a also has a density of through-dislocations of 107 cm$^{-2}$ or less, preferably less than $5 \times 10^6$ cm$^{-2}$.

The crystal flexure or curvature of a crystal or a wafer is measured by diffraction of rays as described in publication "curvature and bow of bulk GaN substrates" de Humberto M. Foronda et al. published in Journal of Applied Physics 120, 035104 (2016). The crystal radius of curvature $R_c$ is then defined by the following relation: $R_c = D^2/(8f_c)$ wherein $f_c$ designates the crystal flexure and D the diameter of the crystal or wafer expressed in metres.

The self-supporting crude crystal of GaN 6a having been formed on a starting substrate having a non-zero "miscut" angle, also has a non-zero miscut angle, the orientation of the crystal planes propagating from one layer to the other. For example, in the case of a sapphire substrate 1 with miscut angle equal to 4 degrees, the growth face of the crystal 6a has a miscut angle equal to 4 degrees, preferably between 0.1 and 1 degree over its entire surface.

1.7. Grinding Phase 80

Once the GaN crystal 6a is separated from the starting substrate 1, its grinding begins. Current techniques enable control of the removal of a layer thickness to within 10 micrometres.

1.8. Finishing Phase 90

The finishing operation then proceeds, in order to form the GaN wafers 7.

The rear face is ground and the sides or edges of the wafer 7, followed by polishing in order to obtain a surface condition that is acceptable for the application.

Thus, the proposed method is particularly suitable for manufacturing slices or wafers of semiconductor material, in particular slices or wafers of material of group 13 and 15 elements of the periodic table, more particularly slices or wafers composed of nitride of a group 13 element, preferably GaN, of large diameter, greater than 50 mm, greater than 100 mm or even greater than 150 to 200 mm.

The prior performance of phase 40 promotes the obtaining in phase 90 of a continuous GaN surface Ga face or (0001), having no voids or depressions greater than 25 μm in diameter.

The slice or wafer of semiconductor material 7 according to FIG. 3, formed according to the method of the invention, has a thickness of 200 to 2000 micrometres and an excellent crystal quality such that the width at half height of the x-ray diffraction peak (XRD) of the (002) line around the angle ω under symmetric conditions of the GaN (0001) films is less than 130 arcsec.

Advantageously, but optionally, the final wafer obtained according to the method of the invention also has the following features:

- the crystal radius of curvature is greater than 11 m,
- the surface macrodefect density is less than 6 cm$^{-2}$ and preferably less than 3 cm$^{-2}$,
- the crystal quality measured by the width at half height of the x-ray diffraction peak (XRD) of the (002) line around the angle ω under symmetric conditions of the GaN (0001) planes less than 130 arcsec, preferably less than 100 arcsec, preferably less than 90 arcsec, or even less than 60 arcsec and the width at half height of the x-ray diffraction peak (XRD) of the 201 line around the angle ω under oblique conditions of the GaN (0001) films less than 240 arcsec, preferably less than 140 arcsec, or even less than 100 arcsec,
- a cracking rate measured by optical microscopy and corresponding to the sum of the length of the cracks of said crystal wafer divided by the diameter of said wafer is less than 0.5,
- a continuous Ga face surface, having no voids or depressions greater than 50 μm in diameter.

According to another possible method, by way of illustration and with the difference from the precedingly described method that the monocrystalline material according to the invention is obtained by growth on a starting substrate or seed, for example sapphire, on which a layer of nitride GaN has been deposited, preferably beforehand and preferably of at least several micrometres and less than 10 micrometres. The growth is carried out in an HVPE reactor. The epitaxial deposition is carried out under the same conditions as phase 30 described above, but continued over a longer period in order to form a layer of several mm.

The crystal 6a undergoes a trimming operation then is cut into a plurality of slices or wafers typically having a thickness of 100 to 600 micrometres using a loose wire saw (abrasive particles in a slurry which impregnate the wire before cutting), or fixed wire saw (abrasive particles fixed beforehand on the wire). The finishing steps (pre-polishing, polishing) are similar to the previously described method.

The present invention and its advantages are illustrated using the following examples. The examples according to the invention should of course not be considered to limit its implementation.

Exemplary Embodiments

In the following examples a starting sapphire substrate was loaded into a CVD reactor, followed by deposition of an element M selected among Ge, Zr, Y, Si, B, Sc, Mg, In, W, La, Ti, Ta, Hf or an alloy of these elements.

The deposition of Ge is carried out at approximately 950° C. at a pressure less than 400 mbar for a thickness between 250 nm and 3 µm. The precursor used for the vapour phase deposition being GeCl4.

The deposition of Zr is carried out at approximately 450° C. at a pressure less than 400 mbar for a thickness between 250 nm and 3 µm. The precursor used for the vapour phase deposition being a Zr amidinate (Zr-AMD).

The deposition of Y is carried out at approximately 500° C. according to the deposition method, at a pressure less than 400 mbar for a thickness between 250 nm and 3 µm. The precursor used being an yttrium β-diketone.

The deposition of Si is carried out at approximately 900° C. at a pressure less than 400 mbar for a thickness between 250 nm and 3 µm. The precursor used being SiH4.

The deposition of B is carried out at approximately 1300° C. at a pressure less than 400 mbar for a thickness between 250 nm and 3 µm. The precursor used being BCl3.

The deposition of Sc is carried out at approximately 1100° C. at a pressure less than 400 mbar for a thickness between 250 nm and 3 µm. The precursor used being Tris(cyclopentadienyl)scandium.

The deposition of Mg is carried out at approximately 900° C. at a pressure less than 400 mbar for a thickness between 250 nm and 3 µm. The precursor used being Cp2Mg (Bis(cyclopentadienyl)magnesium).

The deposition of In is carried out at approximately 500° C. at a pressure less than 400 mbar for a thickness between 250 nm and 3 µm. The precursor used being TMI (Trimethyl-indium).

The deposition of W is carried out at approximately 650° C. at a pressure less than 400 mbar for a thickness between 250 nm and 3 µm. The precursor used being Cl4(PhCN)W (NPh).

The deposition of La is carried out at approximately 450° C. at a pressure less than 400 mbar for a thickness between 250 nm and 3 µm. The precursor used being Lanthanum β-diketonate.

The deposition of Ti is carried out at approximately 600° C. at a pressure less than 400 mbar for a thickness between 250 nm and 3 µm. The precursor used being TiCl2.

The deposition of Ta is carried out at approximately 600° C. at a pressure less than 400 mbar for a thickness between 250 nm and 3 µm. The precursor used being tert-butylimido-tris-ethylmethylamido-tantalum (TBTEMT).

The deposition of Hf is carried out at approximately 700° C. at a pressure less than 400 mbar for a thickness between 250 nm and 3 µm. The precursor used being $Hf(NMe_2)_4$.

In a first part of the preceding examples, a substrate, preferably sapphire, was heated beforehand in the CVD reactor chamber to a temperature of approximately 1000° C. under nitrogen at a pressure of approximately 130 mbar. Ammonia is then introduced into the chamber at a concentration of approximately 20 slm for 5 minutes. This first interface layer between the sapphire substrate and the layer of element M has a crystal thickness of 0.5 to 5 nanometres, as described above.

In a second part of the preceding examples, a second interface layer is obtained according to the following procedure. In particular, ammonia is again introduced into the chamber at a concentration between 2000 and 10,000 slm for several seconds in order to activate the surface of the separation layer comprising the element M, then trimethyl-aluminium is introduced into the reactor chamber via nitrogen as carrier gas in order to form a surface layer of nitride of element M and aluminium by reaction with element M.

The amorphous interface layer has a thickness of approximately 0.5 to 5 nanometres.

In a third part of the preceding examples, no first or second interface layer was deposited.

For all these series of examples, a nucleation layer of AlN of approximately 100 nm to 2 µm was then deposited. The crystals obtained after separation were ground according to an identical procedure in order to obtain a wafer.

The characterisations of these substrates reveal similar results whatever the element M chosen and are presented in the following table.

|  | Example 1 | Example 2 | Example 3 | Example 4 |
|---|---|---|---|---|
| Interface layer between substrate and separation layer | no | Yes | No | Yes |
| Interface layer between separation layer and nucleation layer | No | No | Yes | Yes |
| Nucleation layer | AlN | AlN | AlN | AlN |
| Surface density of macro-inclusions or macrodefects ($cm^{-2}$) | <5 | <5 | <3 | <3 |
| Crystal radius of curvature (m) | >11 | >11 | >11 | >11 |
| Cracking rate measured by optical microscopy and corresponding to the sum of the length of the cracks of the wafer or of the crystal obtained divided by its diameter | 0.5 to 1 | 0 to 0.5 | 1 to 2 | < 0.25 |
| Width at half height of the x-ray diffraction peak (XRD) of the (002) line around the angle ω under symmetric conditions of the GaN (0001) planes (arcsec) | 110-135 | 90-120 | 70-90 | 70-90 |
| Ratio of electrical resistivity measured | <2.0 | <1.6 | <1.6 | <1.6 |

-continued

|  | Example 1 | Example 2 | Example 3 | Example 4 |
|---|---|---|---|---|
| by the Hall effect from the edge at 40 mm from the centre of the wafer over that of the centre of the crystal wafer obtained (for an average n-type doping with an electron density of $1.10^{18}/cm^3$) |  |  |  |  |
| Difference in absolute value between the width at half height of the x-ray diffraction peak (XRD) of the (002) line around the angle ω under symmetric conditions, of the GaN (0001) planes measured at 40 mm from the centre and at the centre of the crystal wafer obtained (in arcsec) | 5-25 | <20 | <20 | <20 |

The large reduction in the surface density of macro-inclusions can be seen, typically less than $3/cm^2$ for examples 3 and 4 (according to the invention) compared with example 1 (comparative). Likewise crystal quality measured by the width at half height of the x-ray diffraction peak (XRD) of the (002) line around the angle ω under symmetric conditions of the GaN (0001) planes is improved by at least 15 arcsec in the case of example 2 (according to the invention) or even more than 40 arcsec for examples 3 and 4 compared with example 1. Moreover, it has been observed that the crystal quality measured by XRD, exactly like the electrical resistivity, is very homogeneous between the centre and the edge of the crystal wafer. The inventors have notably discovered that once covered with the separation layer 3, which is composed of a material other than a nitride of a group III element, the interface layer 2, advantageously stabilised at low temperature (<700° C.), was not sublimated during the growth phase of the nucleation layer 5, in other words before the separation step. Moreover it has been observed that this interface layer 2, formed of oxygen, nitrogen and aluminium, contributes to reducing the risk of cracking of successive separation and nucleation layers and layer of nitride of a group III element before separation step d).

In addition, it has been observed by the inventors that the interface layer 4 between the separation layer 3 and the nucleation layer 5 leads to an increase in the crystal quality of the nucleation layer 5 which is coalesced better and does so homogeneously over the wafer. The quality of the monocrystalline layer of nitride of a group 13 element is strongly improved (less dislocations or less inclusions of nitrides of a group III element having a misorientation of the main crystal axis with respect to the crystal matrix (>5°)).

Furthermore, due to the misorientation of the crystal grains which compose the nucleation layer 5, during HVPE growth, the surface of the three-dimensional growth front of the group III element layer can have local disparities in the crystal facets exposed at the surface. The direct consequence is a local doping difference due to the difference in incorporation of dopants depending on the crystal facet exposed. There is therefore an interest in having a reduced grain misorientation and homogeneous over the entire wafer in order to obtain similar electrical properties in different places on the wafer after HVPE growth.

In addition, a better coalesced, slightly misoriented and homogeneous nucleation layer 5 over the entire wafer reduces the variations which can exist at the surface of the three-dimensional growth front of the layer of a group III element during HVPE growth.

The direct consequence is that after grinding of the layer of a group III element coming from growth by HVPE, a flat and continuous surface is obtained, having no voids or depressions greater than 50 μm in diameter and preferably not greater than 25 μm in diameter.

These advantages in terms of performance and homogeneity are beneficial for the use because the current distribution in the LED, laser and power transistor manufactured from this wafer is improved. For optical applications, this also leads to improvement in the homogeneity of the absorption of the layer of nitride of a group III element.

The invention claimed is:

1. A method for manufacturing a monocrystalline semiconductor material of nitride of a group 13 element, comprising:
    forming a first $M_vAl_xO_yN_z$ interface layer on a starting substrate by annealing the starting substrate at a temperature greater than 700° C. in an environment containing ammonia gas;
    forming, on the first $M_vAl_xO_yN_z$ interface layer, at least one separation layer comprising an element M selected among Ge, Zr, Y, Si, B, Sc, Mg, In, W, La, Ti, Ta, Hf or an alloy of these elements, by epitaxial growth;
    depositing, by epitaxial growth, at least one nucleation layer of formula $Al_rGa_sIn_tN_u$ wherein the atomic indices r, s, t and u comply with the following relations: u=1 and r+s+t=1, the at least one nucleation layer being deposited at a temperature greater than 700° C.; and
    depositing, by epitaxial growth, at least one continuous monocrystalline layer of the monocrystalline semiconductor material of nitride of a group 13 element;
    wherein the first $M_vAl_xO_yN_z$ interface layer is such that:
    the atomic indices x and z are greater than 0 and less than or equal to 1,
    the atomic indices v and y are between 0 and 1,
    the sum y+z is greater than 0.9 and less than or equal to 1.5, and
    the sum v+y is greater than or equal to 0.3 and less than or equal to 1.

2. The method according to claim 1, wherein the at least one continuous monocrystalline layer is deposited at a temperature between 900° C. and 1,200° C.

3. The method according to claim 1, wherein the index v of the first $M_vAl_xO_yN_z$ interface layer is equal to 0.

4. The method according to claim 1, wherein a second interface layer of formula $M_vAl_xO_yN_z$ is deposited between the at least one separation layer and the at least one nucleation layer being such that:

the atomic indices x and z are greater than 0 and less than or equal to 1, the atomic indices v and y are between 0 and 1, the sum y+z is greater than 0.9 and less than or equal to 1.5, and the sum v+y is greater than or equal to 0.3 and less than or equal to 1.

5. The method according to claim 1, wherein the at least one separation layer has a thickness less than 1 µm.

6. The method according to claim 1, wherein the at least one separation layer includes two or more successive layers containing a different element M selected among Ge, Zr, Y, Si, B, Sc, Mg, In, W, La, Ti, Ta or Hf.

7. The method according to claim 1, wherein the at least one separation layer includes two or more successive layers containing an element M selected among Ge, Zr, Y, Si, B, Sc, Mg, In, W, La, Ti, Ta or Hf, each of the at least one separation layer having a different element from that of another separation layer of the at least one separation layer which supports it.

8. The method according to claim 1, wherein the at least one separation layer includes an alloy of elements M selected among Ge, Zr, Y, Si, B, Sc, Mg, In, W, La, Ti, Ta or Hf.

9. The method according to claim 1, wherein the at least one separation layer, the at least one nucleation layer and the first $M_vAl_xO_yN_z$ interface layer are deposited at a growth speed less than 10 micrometres per hour according to a metalorganic vapor phase epitaxy (MOVPE) or molecular beam epitaxy (MBE) technique, and the at least one continuous monocrystalline layer of the monocrystalline semiconductor material of nitride of a group 13 element is obtained by epitaxial growth according to a hydride vapor phase epitaxy (HVPE) technique.

10. The method according to claim 1, wherein the index y is equal to 0 if the first $M_vAl_xO_yN_z$ interface layer is deposited between the at least one separation layer and the at least one nucleation layer.

11. The method according to claim 1, wherein the first $M_vAl_xO_yN_z$ interface layer deposited between the at least one separation layer and the at least one nucleation layer is a crystalline layer, or the first $M_vAl_xO_yN_z$ interface layer deposited between the starting substrate and the at least one separation layer is an amorphous layer.

12. The method according to claim 1, wherein the first $M_vAl_xO_yN_z$ interface layer of formula $Al_xO_yN_z$ is such that the atomic indices x, y and z are less than or equal to 1.

13. The method according to claim 1, wherein a second interface layer of formula $M_vAl_yN_z$, in which the atomic indices v, y and z are less than 1, is deposited between the at least one separation layer and the at least one nucleation layer.

14. The method according to claim 1, wherein the thickness of the first $M_vAl_xO_yN_z$ interface layer is greater than 0.1 nanometres and/or less than 50 nanometres.

15. The method according to claim 1, wherein the at least one nucleation layer is formed of $Al_xGa_{1-x}N$ with $0.55 \leq x \leq 1$.

16. The method according to claim 1, wherein a layer of $Si_xN_y$ is deposited on the at least one nucleation layer before depositing the at least one continuous monocrystalline layer.

17. The method according to claim 1, further comprising:
separating the starting substrate from the at least one continuous monocrystalline layer in order to obtain a crude crystal of nitride of a group 13 element.

18. The method according to claim 17, further comprising:
grinding, by removing at least a portion of the at least one continuous monocrystalline layer, in order to obtain a two-dimensional wafer of nitride of a group 13 element with a thickness between 200 µm and 2,000 µm.

* * * * *